US007167582B2

(12) United States Patent
Ishikawa

(10) Patent No.: US 7,167,582 B2
(45) Date of Patent: Jan. 23, 2007

(54) MASK INSPECTION METHOD, MASK DEFECT INSPECTION SYSTEM, AND METHOD OF PRODUCTION OF MASK

(75) Inventor: Kiichi Ishikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 675 days.

(21) Appl. No.: 10/453,714

(22) Filed: Jun. 3, 2003

(65) Prior Publication Data
US 2004/0018436 A1   Jan. 29, 2004

(30) Foreign Application Priority Data
Jun. 6, 2002    (JP)    ............... 2002-165691

(51) Int. Cl.
*G06K 9/00* (2006.01)
(52) U.S. Cl. .................. 382/144; 356/237.1; 382/149; 430/5; 430/296
(58) Field of Classification Search ............. 356/237.5, 356/394, 237.1; 430/5, 296; 382/144, 145, 382/149
See application file for complete search history.

(56) References Cited

U.S. PATENT DOCUMENTS

| | | | |
|---|---|---|---|
| 5,721,074 A * | 2/1998 | Bae ............................... 430/5 |
| 5,767,974 A * | 6/1998 | Higashiguchi et al. ...... 356/394 |
| 5,828,457 A * | 10/1998 | Tabata et al. ............... 356/394 |
| 5,995,219 A * | 11/1999 | Tabata ..................... 356/237.5 |
| 6,295,126 B1 * | 9/2001 | Miyazaki et al. ......... 356/237.5 |
| 6,334,097 B1 * | 12/2001 | Yoshitake et al. .......... 702/185 |
| 6,335,129 B1 * | 1/2002 | Asano et al. .................. 430/5 |
| 6,340,543 B1 * | 1/2002 | Nagamura et al. ............. 430/5 |
| 6,440,615 B1 * | 8/2002 | Shimizu ........................ 430/5 |
| 6,483,937 B1 * | 11/2002 | Samuels ..................... 382/144 |
| 6,778,695 B1 * | 8/2004 | Schellenberg et al. ...... 382/144 |
| 6,799,130 B1 * | 9/2004 | Okabe et al. ................. 702/82 |
| 6,861,179 B1 * | 3/2005 | Hsieh et al. ................... 430/5 |
| 6,925,202 B1 * | 8/2005 | Karklin et al. ............. 382/145 |
| 7,035,449 B1 * | 4/2006 | Hung et al. ................. 382/149 |
| 2004/0018436 A1 * | 1/2004 | Ishikawa ....................... 430/5 |

* cited by examiner

*Primary Examiner*—Gregory Desire
(74) *Attorney, Agent, or Firm*—Sonnenschein Nath & Rosenthal LLP

(57) ABSTRACT

A method of inspection for detecting pattern defects in a mask used for transferring a predetermined pattern of regions passing and blocking an exposure beam, comprising the steps of presetting different acceptable defect sizes for a plurality of conditions different in the line and/or space of the pattern, detecting a defect and recognizing the line and space of the pattern at the defect part, selecting an acceptable defect size corresponding to the line and space of the pattern recognized at the defect part and comparing it with the size of the detected defect, and determining a defect larger than the acceptable defect size as a defect requiring repair; a mask defect inspection system for inspection according to the method, and a mask production method including a step of the inspection.

17 Claims, 12 Drawing Sheets

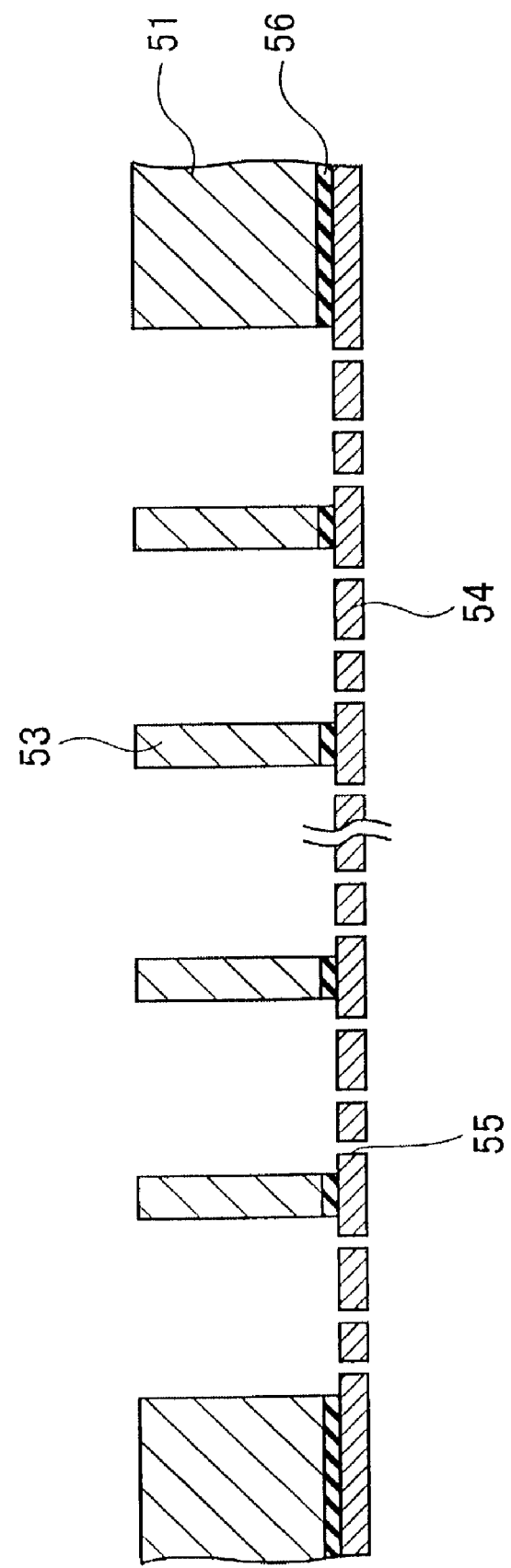

MASK INSPECTION METHOD, MASK DEFECT INSPECTION SYSTEM, AND METHOD OF PRODUCTION OF MASK

BACKGROUND OF THE INVENTION

1. Field of the Invention

The present invention relates to methods of inspection and production of a mask used in a lithography step in production of a semiconductor device etc. and to a mask defect inspection system.

2. Description of the Related Art

Along with the miniaturization of semiconductor devices, the pattern size on a photomask used for photolithography has become increasingly smaller. Up to now, in photolithography, accuracy of formation of fine patterns has been improved by shortening the exposure wavelength. However, in recent years, transfer patterns have become shorter than the exposure wavelength, so super-resolution techniques have been broadly used to extend the life of photomasks at the same exposure wavelength.

Super-resolution techniques are roughly classified into two types: ones conducted at an exposure system (stepper or scanner) side and ones conducted on a mask side. The former techniques are called "modified illumination" and change the method of illumination to improve the resolution. The orbicular zone illumination being widely used at present can be mentioned as an example.

On the other hand, a half-tone type phase shift mask, a Levenson phase shift mask, or other mask is used for the latter techniques. A half-tone type phase shift mask uses a semi-transparent film for its light-blocking regions and generates portions of a zero light intensity by inverting the phase of light passing through light-passing regions and the phase of light passing through the light-blocking regions. A half-tone type phase shift mask is sometimes used together with modified illumination.

A Levenson phase shift mask provides portions differing in optical path lengths (phase shifters) in the non-light blocking regions (light-passing regions). For example, parts of the substrate are removed at non-light-block regions so as to give a phase difference to the light according to where it passes through the mask. Due to this, the resolution of patterns is improved.

According to the super-resolution techniques, miniaturization of patterns becomes possible without shortening the exposure wavelength. However, compared with when miniaturizing patterns by shortening the exposure wavelength, in general, in super-resolution techniques, line width errors, defects, etc. on the mask have a greater effect on the transfer patterns.

Further, when forming a dense pattern on the phase shift mask, the amount of the light passing through the mask decreases and sufficient contrast cannot be obtained, so the effect of defects becomes greater. As opposed to this, when forming a sparse pattern, the amount of light passing through the vicinity of defects increases compared with a dense pattern, so that the effect of defects on the transfer becomes relatively smaller.

This phenomenon of the magnitude of the effect of defects on transfer changing depending on the pattern density is also observed in conventional photolithography not using super-resolution techniques. The use of super-resolution techniques however increases the difference between the effects of dense and sparse patterns. Up to now, defects have been determined by comparison with a flat acceptable defect size determined without regard to the pattern density.

Summarizing the problems to be solved by the invention, when using super-resolution techniques, if determining defects based on a flat acceptable defect size, there is a possibility of defects which might actually affect transfer being allowed in dense portions of a pattern. Conversely, there is a possibility of defect which actually have no effect on transfer not being allowed in sparse portions of a pattern. Therefore, with the conventional method of detection of defects based on a flat acceptable defect size, it becomes difficult to determine defects.

A defect is usually repaired by removing the corresponding part of the light-blocking film by a focused ion beam (FIB) or by depositing additional material by the FIB in the presence of an organic gas. Generally, the smaller the defect, the more difficult it is to repair the defect with a high accuracy. Therefore, when setting a flat acceptable defect size, if the acceptable defect size is made smaller and the number of defects increases, the time required for precise repair of all the defects becomes longer. Due to this, the throughput of the production of masks is lowered.

If trying to shorten the time required for repairing defects, the problem arises of a drop in the probability of repair of defects at a defect repair system. Namely, the yield in the production of masks is lowered. Consequently, it has become important to select defects requiring repair instead of repairing all the defects detected at inspections without selection.

SUMMARY OF THE INVENTION

An object of the present invention is to provide a method of inspection of a mask formed with a fine pattern able to detect a defect requiring repair accurately and easily and a mask defect inspection system.

Another object of the present invention is to provide a mask production method able to improve the throughput and yield in production of masks.

According to a first aspect of the present invention, there is provided a method of inspection for detecting a pattern defect in a mask having a predetermined pattern of regions passing and blocking an exposure beam so as to transfer that pattern, comprising the steps of presetting different acceptable defect sizes for a plurality of conditions differing in at least one of a line and space of the pattern, detecting a defect and recognizing the line and space of the pattern at the defect part, selecting an acceptable defect size corresponding to the line and space of the pattern recognized at the defect part and comparing it with the size of the detected defect, and determining a defect larger than the acceptable defect size as a defect requiring repair.

According to a second aspect of the present invention, there is provided a mask defect inspection system for detecting a pattern defect in a mask having a predetermined pattern of regions passing and blocking an exposure beam so as to transfer that pattern, comprising a memory mean for recording preset different acceptable defect sizes for a plurality of conditions differing in at least one of a line and space of the pattern, a pattern identifying means for comparing a mask pattern with a reference pattern to detect a defect, a measuring mean for recognizing the line and space of the pattern at the detected defect part, and a defect determining means for selecting an acceptable defect size corresponding to the line and space of the pattern recognized at the defect part from the acceptable defect sizes recorded in the memory mean, comparing it with the size of the detected defect, and determining a defect larger than the acceptable defect size as a defect requiring repair.

Due to this, it becomes possible to accurately determine defects requiring repair in mask defect inspection. Therefore, it becomes unnecessary to repair defects not causing a problem in exposure and therefore reduce the time required for defect repair. Further, since the number of defects covered by repair is reduced, it becomes possible to repair defects with a high accuracy.

According to a third aspect of the present invention, there is provided a mask production method comprising the steps of forming a predetermined pattern of regions passing and blocking an exposure beam in a mask and detecting defects of the pattern, said step of detecting the defects comprising the steps of presetting different acceptable defect sizes for a plurality of conditions differing in at least one of a line and space of the pattern, detecting a defect and recognizing the line and space of the pattern at the defect part, selecting an acceptable defect size corresponding to the line and space of the pattern recognized at the defect part and comparing it with the size of the detected defect, and determining a defect larger than the acceptable defect size as a defect requiring repair.

Due to this, only defects substantially affecting transfer are repaired, and the time required for repairing defects not substantially affecting transfer becomes unnecessary. Therefore, the throughput of mask production is improved. Also, when comparing with a case of detecting defects using a flat acceptable defect size, the number of repaired defects can be reduced and accurate repair of detects becomes possible. Therefore, the yield of mask production is improved.

BRIEF DESCRIPTION OF THE DRAWINGS

These and other objects and features of the present invention will become more apparent from the following description of the preferred embodiments given with reference to the accompanying drawings, in which:

FIG. 5A is an example of a pattern and a defect isolated from the pattern, while

FIG. 6A is a mask pattern of a photomask without any defect, while

FIG. 10B is a cross-sectional view of the mask of FIG. 10A.

DESCRIPTION OF THE PREFERRED EMBODIMENTS

Below, preferred embodiments of the mask inspection method, mask defect inspection system, and mask production method of the present invention will be described with reference to the accompanying drawings. The present invention can be applied to inspection of a mask used for photolithography employing super-resolution techniques. Here, the super-resolution techniques include the techniques of the exposure system side (modified illumination) or mask side (phase shift masks) or both combined.

Figure 1:
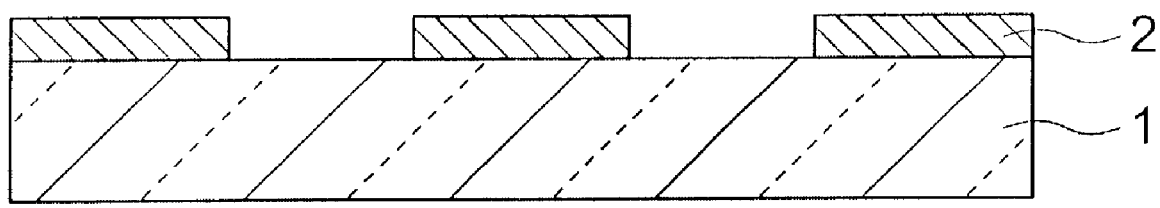
FIG. 1 is a cross-sectional view of a photomask to which the mask inspection method of the present invention is applied.

FIG. 1 is a cross-sectional view of an example of a photomask to which the mask inspection and production methods of the present invention are applied. As shown in FIG. 1, a predetermined pattern of light-blocking regions is formed by a light-blocking film 2 on a glass substrate 1. Non-light-blocking regions are not formed with the light-blocking film 2. A binary mask is a mask wherein the light-blocking film 2 does not pass any light. Modified illumination is used as the super-resolution technique for the usual binary mask.

When the light-blocking film 2 is a semi-transparent film (half-tone type phase shift mask), modified illumination need not be used, but can be used in combination if desired. It is also possible to apply the present invention to inspection and production of a Levenson phase shift mask or other photomask.

Figure 2A:
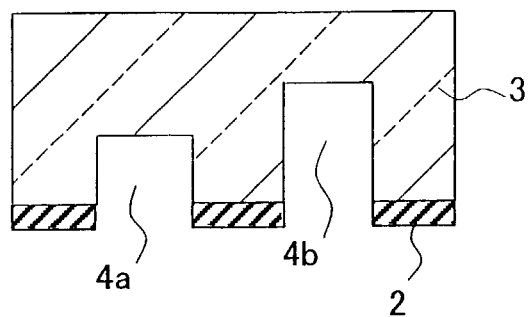
FIGS. 2A to 2C are cross-sectional views of photomasks to which a mask inspection method of the present invention is applied.
Figure 2B:
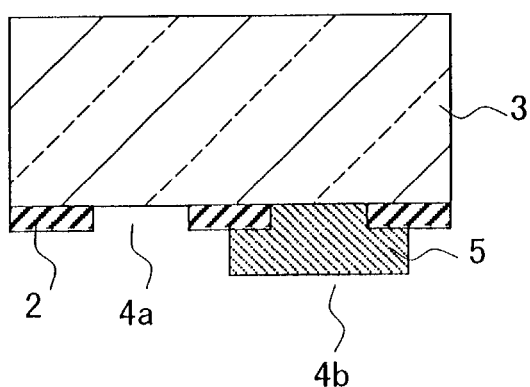
Figure 2C:
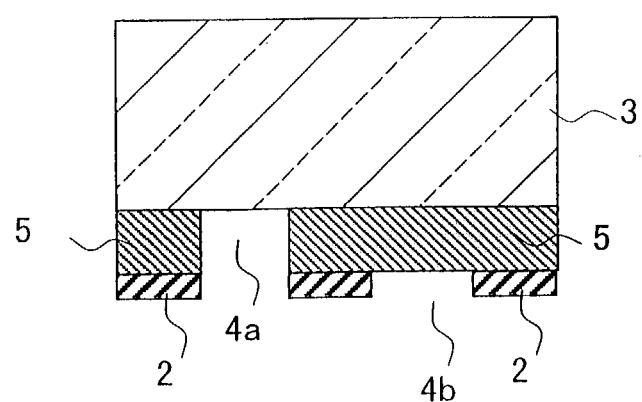

FIGS. 2A to 2C are cross-sectional views of examples of phase shift masks. As shown in FIGS. 2A to 2C, a quartz substrate 3 has a light-blocking film 2 formed on it. The regions between parts of the light-blocking film 2 serve as light-passing regions. In a phase shift mask, phases of passing lights invert between adjacent light-passing regions.

The mask of FIG. 2A is formed at light-passing regions 4a, 4b with trenches differing in depth. Due to this, light passing through the light-passing regions 4a and light passing through the light-passing regions 4b are inverted in phase. The masks of FIGS. 2B and 2C are formed at light-passing regions 4b with phase shifters 5 having predetermined refractive indexes and thicknesses. Due to this, light passing through the light-passing regions 4a and light passing through the light-passing regions 4b invert in phase. The phase shifter 5a may be formed either on the quartz substrate via the light-blocking film as shown in FIG. 2B or between the quartz substrate and light-blocking film as shown in FIG. 2C.

Further, the present invention may also be applied to inspection of defects and production of masks used for lithography other than photolithography. For example, it is also possible to apply the present invention to inspection of defects and production of masks used for lithography employing a charged particle beam such as electron beam lithography and ion beam lithography. A stencil mask or membrane mask is used for lithography employing a charged particle beam as an exposure beam.

A stencil mask is a mask comprised of a thin film (membrane) formed with apertures in a predetermined mask pattern. The apertures pass a charged particle beam. On the other hand, a membrane mask is a mask comprised of a thin film through which the charged particle beam passes formed with a metal or other layer scattering the charged particle beam in a predetermined pattern. It is also possible to apply the present invention to defect inspection and production of a mask used for X-ray lithography for example.

Figure 3:
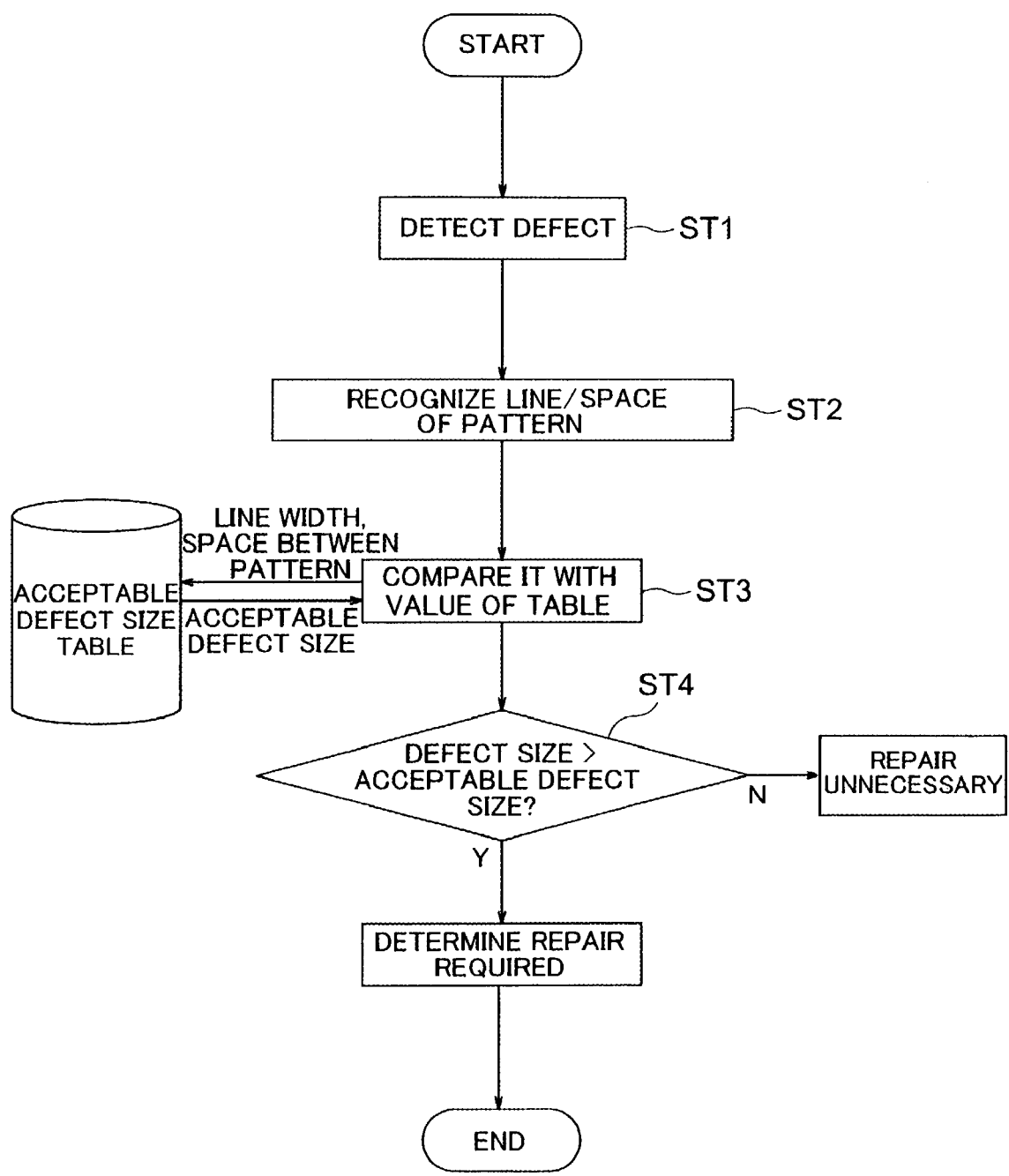
FIG. 3 is a flow chart of a mask inspection method of the present invention.

FIG. 3 is a flow chart of a mask inspection method of the present embodiment. As shown in FIG. 3, according to the mask inspection method of the present embodiment, at step 1 (ST1), part of a pattern (defect) different from a desired pattern is detected on a mask.

At step 2 (ST2), the pattern size and pattern pitch of the defect part are recognized. Here, the "pattern size" represents the line width of the pattern on the mask.

At step 3 (ST3), the size of a defect detected at step 1 is compared with a certain acceptable defect size in a table of acceptable defect sizes prepared in advance and recorded in a mask defect inspection system. At step 4 (ST4), if the defect size is not more than the acceptable defect size, it is determined that repair of the defect is unnecessary and the defect is not repaired. If the defect size is more than the acceptable defect size, it is determined that repair of the defect is necessary and the defect is repaired. This finishes the summary of the mask inspection method of the present embodiment.

Figure 4:
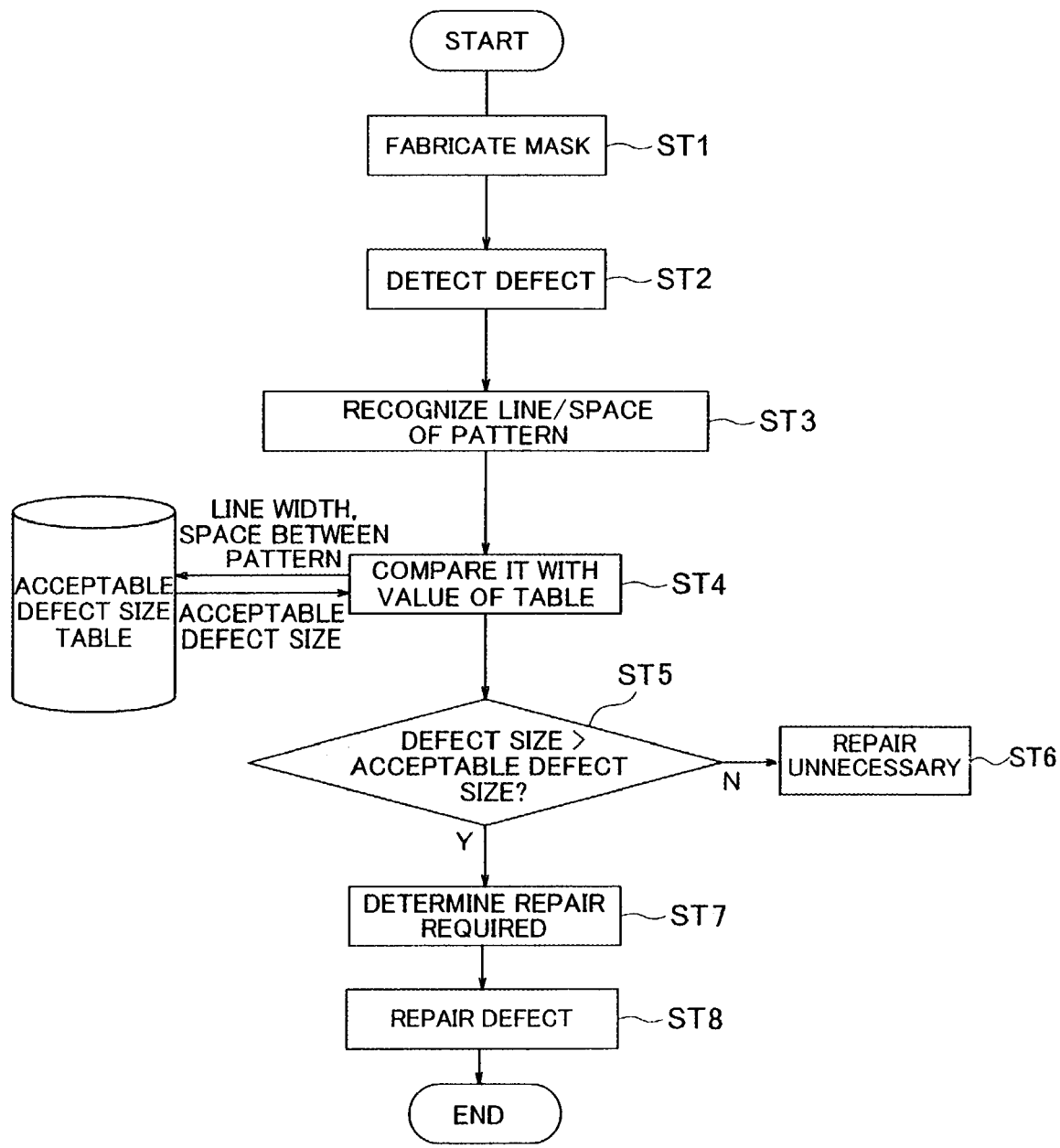
FIG. 4 is a flow chart of a mask production method of the present invention.

FIG. 4 is a flow chart showing a mask production method of the present embodiment. As shown in FIG. 4, according to the mask production method of the present embodiment, at step 1 (ST1), a mask having regions passing and not passing an exposure beam is fabricated. At step 2 (ST2), part of the pattern (defect) different from the desired pattern is detected on the mask. At step 3 (ST3), the pattern size and pattern pitch of the defect part are recognized. Here, the "pattern size" indicates the line width of the pattern on the mask.

At step 4 (ST4), the size of a defect detected at step 1 is compared with a certain acceptable defect size in the table of acceptable defect sizes prepared in advance and recorded in the mask defect inspection system. At step 5 (ST5), if the defect size is not more than the acceptable defect size, it is determined at step 6 (ST6) that repair of the defect is unnecessary and the defect is not repaired. If the defect size is more than the acceptable defect size at step 5 (ST5), it is determined at step 7 (ST7) that repair of the defect is necessary. At step 8 (ST8), the defect determined as requiring repair is repaired. In the repair of the defect, for example, an FIB is used to remove an unnecessary part of the light-blocking film or is used in the presence of an organic gas so as to deposit part of a light-blocking film. This completes the summary of the mask production method of the present embodiment.

The acceptable defect sizes in the table of acceptable defect sizes are found from simulation of the light intensity or from the results of experiments using actually fabricated masks. When finding the acceptable defect sizes from experiments, a mask including a defect of a known size is used to transfer a pattern on the resist on a wafer.

For example, in the case of a phase shift mask used for production of device of a design rule of 0.1 μm, the smallest pattern size on the mask becomes about 0.3 μm. If the exposure wavelength is made 193 nm, the line width of the pattern transferred on the wafer (transfer line width) sometimes becomes smaller than the exposure wavelength.

In the table of the acceptable defect sizes, the pattern sizes are set for example from 1.0 μm to 0.3 μm at intervals of 0.1 μm and the pattern pitches are set in a range of 1:1 to 2.5. Here, the "pattern pitch" indicates the relative ratio of the line width and the pattern space and is expressed as 1:n where the line width is "1" and the pattern space "n". For the purpose of evaluating the printability of a defect, a defect of a predetermined size is arranged in the above pattern. The acceptable defect size changes depending on the positional relationship of the pattern and the defect too. The positional relationship of the pattern and the defect is expressed by for example the space between the pattern and the defect. Here, the positional relationships include a case where the pattern and the defect are in contact and there is no space between them. It is also possible in the table of the acceptable defect sizes to differentiate defects different in positional relationship from each other as different types of defect and to set a different acceptable defect size for each defect type.

Below, the method of preparation of the table of the acceptable defect sizes will be explained. The table of the acceptable defect size is set with the acceptable defect sizes for each pattern size, pattern pitch, and defect type. The procedure for finding the acceptable defect size when the pattern size is 0.4 μm will be explained as an example. Table 1 shows the amounts of transfer line width error when the pattern size is 0.4 μm.

TABLE 1

Error of Transfer Line Width (nm)

| | Defect type | | | | | | | | | | | |
|---|---|---|---|---|---|---|---|---|---|---|---|---|
| | 0.04 μm | | 0.06 μm | | 0.08 μm | | 0.10 μm | | 0.12 μm | | 0.14 μm | |
| | Defect size | | | | | | | | | | | |
| Pitch |  | |  | |  | |  | |  | |  | |
| 1:1.0 | 2.9 nm | 3.3 nm | 6.5 nm | 7.2 nm | 11.8 nm | 12.8 nm | 18.9 nm | 20.0 nm | 29.6 nm | 29.8 nm | 49.8 nm | 45.8 nm |
| 1:1.1 | 2.1 nm | 2.2 nm | 4.7 nm | 5.0 nm | 8.4 nm | 8.8 nm | 13.2 nm | 13.8 nm | 19.6 nm | 20.0 nm | 28.8 nm | 28.2 nm |
| 1:1.2 | 1.7 nm | 1.7 nm | 3.8 nm | 3.9 nm | 6.5 nm | 6.6 nm | 10.6 nm | 10.7 nm | 15.7 nm | 15.9 nm | 22.7 nm | 22.6 nm |
| 1:1.3 | 1.3 nm | 1.3 nm | 3.0 nm | 3.0 nm | 5.4 nm | 5.4 nm | 8.4 nm | 8.4 nm | 12.2 nm | 12.1 nm | 16.9 nm | 16.5 nm |
| 1:1.4 | 1.1 nm | 1.2 nm | 2.7 nm | 2.7 nm | 4.7 nm | 4.8 nm | 7.5 nm | 7.4 nm | 10.7 nm | 10.6 nm | 14.7 nm | 14.3 nm |
| 1:1.5 | 1.0 nm | 1.1 nm | 2.4 nm | 2.4 nm | 4.2 nm | 4.3 nm | 6.6 nm | 6.5 nm | 9.3 nm | 9.5 nm | 12.5 nm | 12.6 nm |
| 1:1.6 | 0.9 nm | 1.0 nm | 2.1 nm | 2.2 nm | 3.7 nm | 3.9 nm | 5.7 nm | 6.0 nm | 8.3 nm | 8.6 nm | 11.3 nm | 11.6 nm |
| 1:1.7 | 0.8 nm | 1.0 nm | 1.9 nm | 2.2 nm | 3.4 nm | 3.7 nm | 5.2 nm | 5.8 nm | 7.6 nm | 7.9 nm | 10.2 nm | 10.8 nm |
| 1:1.8 | 0.7 nm | 0.9 nm | 1.7 nm | 2.1 nm | 3.2 nm | 3.5 nm | 4.8 nm | 5.5 nm | 6.9 nm | 7.3 nm | 9.3 nm | 10.3 nm |
| 1:1.9 | 0.6 nm | 0.9 nm | 1.6 nm | 2.1 nm | 3.0 nm | 3.3 nm | 4.4 nm | 5.2 nm | 6.4 nm | 7.1 nm | 8.6 nm | 9.8 nm |
| 1:2.0 | 0.6 nm | 0.9 nm | 1.5 nm | 1.8 nm | 2.6 nm | 3.2 nm | 4.1 nm | 4.9 nm | 5.9 nm | 7.0 nm | 8.0 nm | 9.4 nm |
| 1:2.1 | 0.6 nm | 0.8 nm | 1.3 nm | 1.8 nm | 2.4 nm | 3.2 nm | 3.8 nm | 4.9 nm | 5.5 nm | 6.9 nm | 7.5 nm | 9.3 nm |
| 1:2.2 | 0.5 nm | 0.8 nm | 1.1 nm | 1.8 nm | 2.2 nm | 3.1 nm | 3.5 nm | 4.8 nm | 5.1 nm | 6.8 nm | 7.0 nm | 9.2 nm |
| 1:2.3 | 0.5 nm | 0.8 nm | 1.0 nm | 1.8 nm | 2.0 nm | 3.1 nm | 3.3 nm | 4.8 nm | 4.7 nm | 6.8 nm | 6.5 nm | 9.1 nm |
| 1:2.4 | 0.5 nm | 0.8 nm | 1.0 nm | 1.7 nm | 1.9 nm | 3.1 nm | 3.1 nm | 4.8 nm | 4.4 nm | 6.8 nm | 6.1 nm | 9.1 nm |
| 1:2.5 | 0.5 nm | 0.8 nm | 1.0 nm | 1.7 nm | 1.8 nm | 3.1 nm | 2.9 nm | 4.8 nm | 4.2 nm | 6.8 nm | 5.7 nm | 9.1 nm |

Figure 5A:
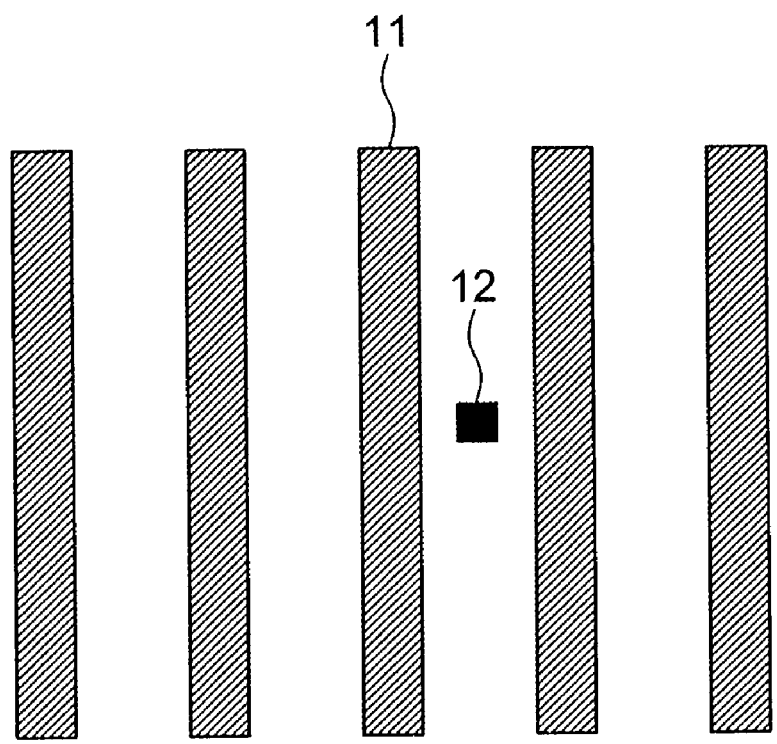
Figure 5B:
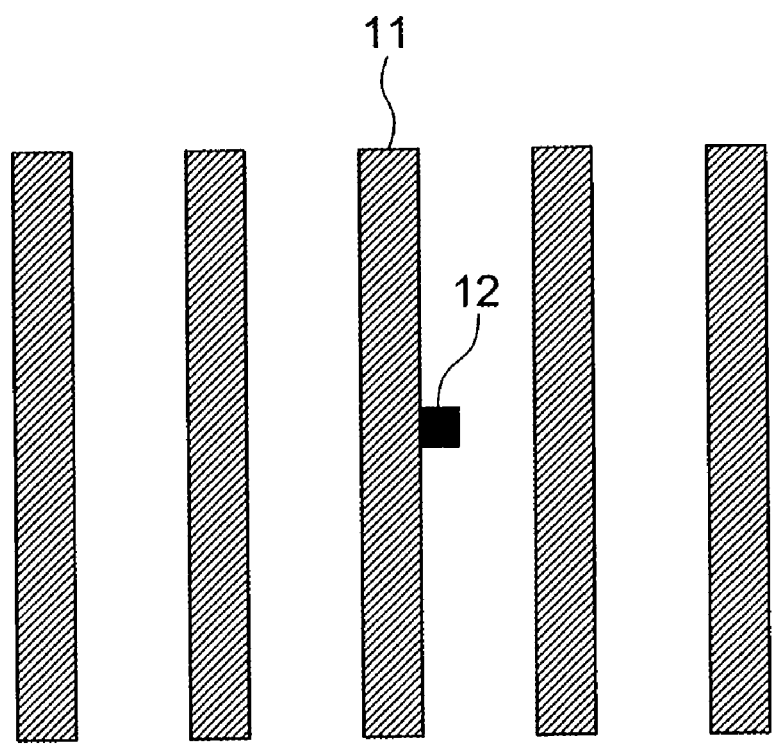
FIG. 5B is an example of a pattern and a defect contacting the pattern.

As shown in Table 1, the defect size, defect type, and pattern pitch were changed to find the transfer line width error under different conditions. Two defect types are set for each defect size. The first defect type is, as shown in FIG. 5A, a defect 12 where the light-blocking film remains isolated between two adjacent parts of the pattern 11. In Table 1, the first defect type is shown at the left column for each defect size. The second defect type is, as shown in FIG. 5B, a defect 12 where the light-blocking film remains contacting an edge of the pattern 11. In Table 1, the second defect type is shown at the right column for each defect size.

Figure 6A:
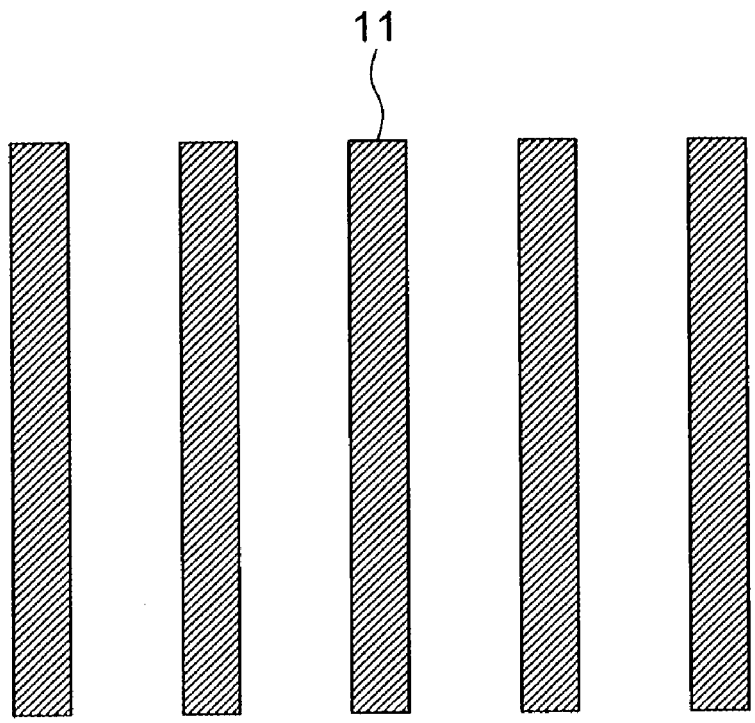

FIG. 6A shows a pattern formed on a mask in state where there are no defects in the pattern as shown in FIGS. 5A and 5B. When using a mask formed with the pattern of FIG. 6A for exposure, the pattern is transferred as shown in FIG. 6B with a transfer line width W1 on the resist on the wafer.

Figure 7:
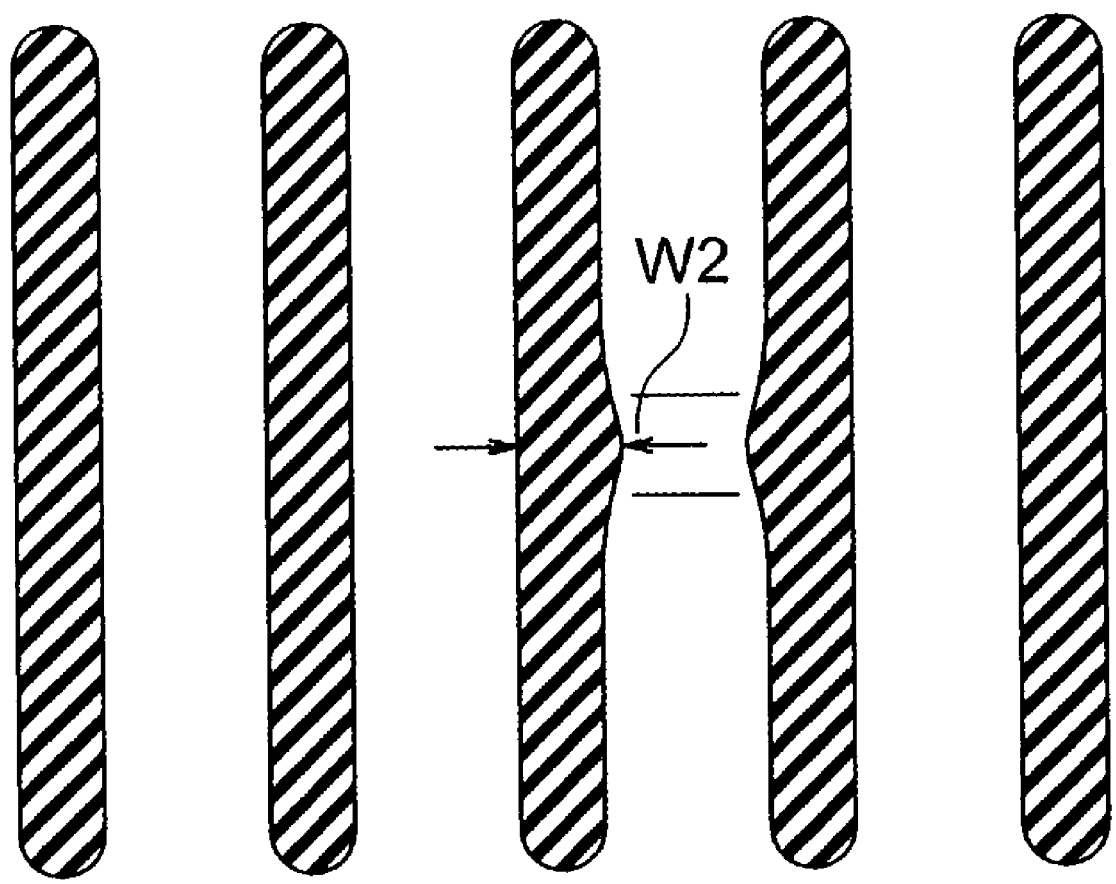
FIG. 7 is a transfer image of the pattern of FIG. 5A.

The pattern transferred on to the resist on the wafer can be examined by simulation of the light intensity (described later) or by experiments using actually fabricated masks. For example, when using a mask including the defect shown in FIG. 5A for exposure, the pattern shown in FIG. 7 is transferred. As shown in FIG. 7, the pattern is transferred at the part of the defect 12 of FIG. 5A with a transfer line width W2.

Figure 6B:
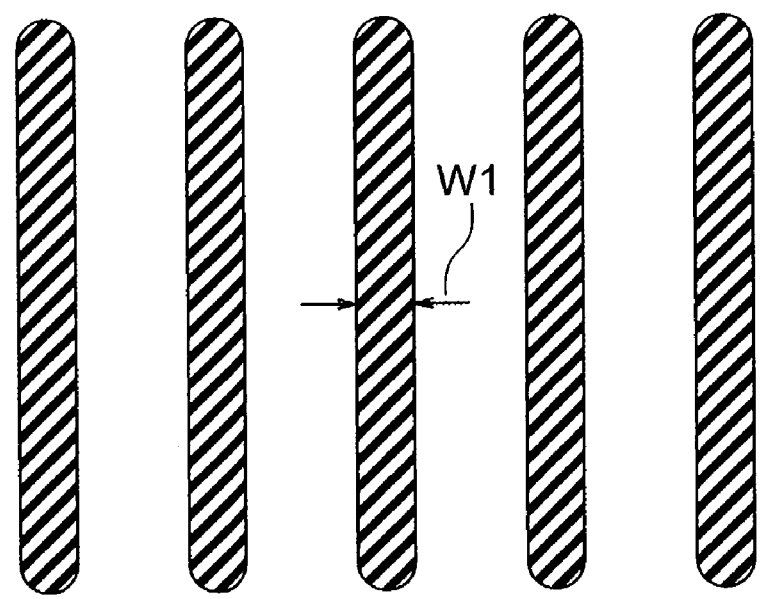
FIG. 6B is a transfer image of the pattern of FIG. 6A.

The transfer line width W1 in the case without the defect shown in FIG. 6B and the transfer line width W2 in the case of the defect of FIG. 7 are compared so as to find the difference of the line widths. This line width difference is made the amount of error of transfer line width. The acceptable range of the amount of transfer line width error is set in advance by experiments etc. to for example within "10% of the transfer line width W1". In Table 1, the maximum size of the defect size serving as the acceptable amount of transfer line width error becomes the acceptable defect size under that condition.

When the transfer line width or the space of the pattern transferred is sufficiently larger than the exposure wavelength, if the pattern sizes on the mask are the same, the transfer line widths become almost constant values corresponding to the magnification of the optical system of the exposure system.

As opposed to this, when including the case wherein the transfer line width and pattern space become not more than the exposure wavelength as in the present embodiment, even if the pattern size is a constant value (0.4 μm), the transfer line width does not become constant, but fluctuates slightly depending on the pattern pitch. Therefore, for the acceptable range of the amount of error of transfer line width, too, no uniform value is applied to the entire Table 1. The acceptable range of the amount of error of transfer line width is set for each pattern pitch and defect type from the transfer line width of the case without a defect.

An example of the procedure for determination of the acceptable defect sizes will be explained next. When the pattern size is the 0.4 μm shown in Table 1, it is assumed that the transfer line width is 0.10 μm at a pattern pitch of 1:1.5 without defect. If the acceptable range of the amount of error of the transfer line width is within "10% of the transfer line width in the case without defect", the acceptable range of the amount of error of the transfer line width becomes within 10 nm.

In Table 1, when the defect size is 0.12 μm, the amounts of the error of the transfer line width become within the acceptable range for both the first defect type and the second defect type. On the other hand, when the defect size becomes 0.14 μm, the amounts of the error of the transfer line width exceed the acceptable range for both the first defect type and the second defect type. Therefore, when the pattern size is 0.4 μm and the pattern pitch 1:1.5, the acceptable defect sizes are 0.12 μm for both the first defect type and the second defect type.

In Table 1, the acceptable defect sizes of the first defect type and the second defect type for all the pattern pitches are found in the same manner. These values are made data for the pattern size of 0.4 μm of the table of the acceptable defect sizes. Other tables corresponding to other pattern sizes are prepared in the same manner as the preparation of Table 1 so as to find the acceptable defect sizes by the same procedure. Due to this, the table of the acceptable defect sizes is obtained.

As shown in Table 1, if the defect sizes are the same, the smaller the pattern pitch, the larger the amount of the error of the transfer line width. Also, if the pattern pitches are the same, the larger the defect size, the larger the amount of the error of the transfer line width.

By setting the acceptable defect sizes by the above procedure, it becomes possible to screen the defects based on not only their size but also their effect on transfer. Therefore, it becomes unnecessary to repair defects causing no actual problem such as defects occurred at for example a part large in pattern space. Due to selective repair of only the defects requiring repair, the time required for repair can be reduced and the accuracy of repair can be improved.

When comparing the size of a defect detected at an inspection of a photomask with the acceptable defect size in the prepared table of the acceptable defect sizes, if the pattern pitch is a value not set in the table of the acceptable defect sizes, the acceptable defect size to be compared is derived as follows.

When the pattern pitch is between a minimum of the pattern pitches in the table of the acceptable defect sizes and a maximum of them (in the example of Table 1, when the pattern pitch is between 1:0 and 2.5), the acceptable defect size is derived by interpolation. When the pattern pitch is smaller than the smallest of the pattern pitches in the table of the acceptable defect sizes (in the example of Table 1, when the pattern pitch is smaller than 1:1.0), the acceptable defect size is found by extrapolation. When the pattern pitch is larger than the largest of the pattern pitches in the table of the acceptable defect sizes (in the example of Table 1, when the pattern pitch is larger than 1:2.5), the acceptable defect size is made the same as the acceptable defect size at the maximum pitch (for example, 1:2.5).

Figure 8:
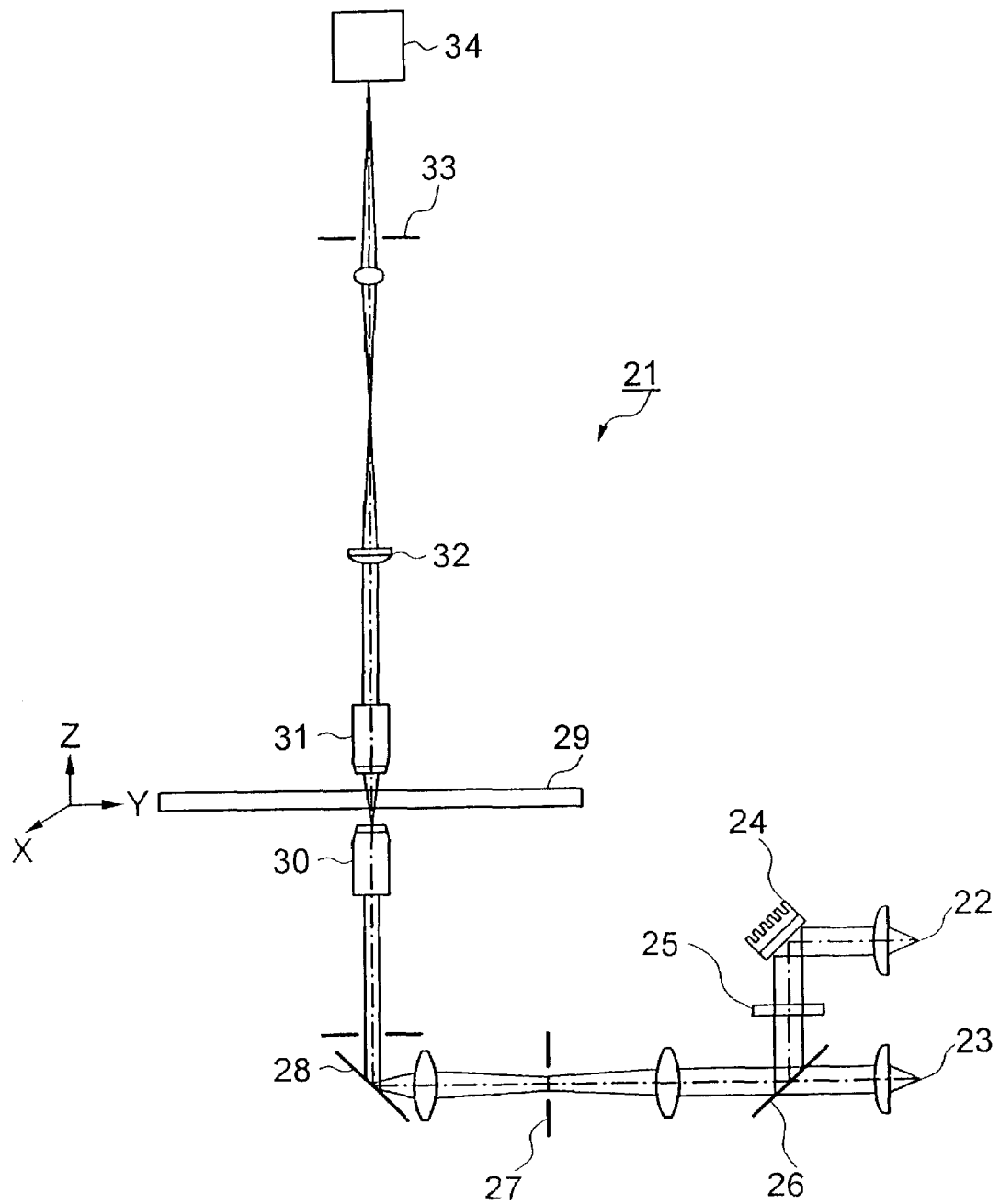
FIG. 8 is a schematic view of an optical system of a system used for simulation of the light intensity for preparation of a table of the acceptable defect sizes in the mask inspection method of the present invention.

Next, the simulation of the light intensity used for preparation of the table of the acceptable defect sizes will be explained. A lithography simulation microscope can be used for the simulation of the light intensity. FIG. 8 shows an optical system of the lithography simulation microscope. According to the lithography simulation microscope, the projection image of a transferred mask pattern can be simulated using an actual photomask.

As shown in FIG. 8, the lithography simulation microscope 21 has as light sources a mercury lamp 22 and a halogen lamp 23 so as to enable measurement at a wavelength of 248 nm and 365 nm. Light from the mercury lamp 22 is guided via a cold mirror 24, a filter 25, and a half mirror 26 to a sigma aperture 27.

By adjusting the sigma aperture 27, a coherence factor σ is set. The coherence factor σ is variable from 0.1 to 1.0. Light passing through the sigma aperture 27 is reflected by a mirror 28 and strikes a photomask 29.

A condenser lens 30 is arranged at one side of the photomask 29 where the light strikes. Light passing through the photomask 29 strikes the objective lens 31. Light passing through the objective lens 31 is focused by a focus lens 32 and detected by a CCD camera 34 via a numerical aperture (NA) setting aperture 33.

Figure 9:
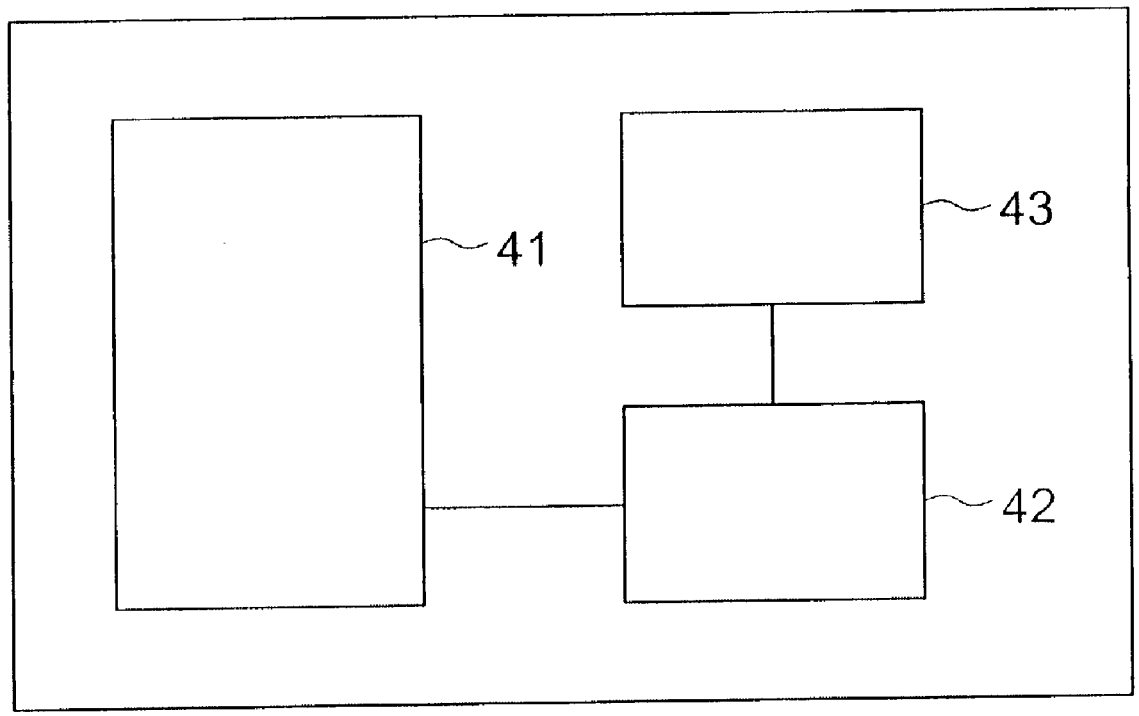
FIG. 9 is a schematic view of a mask defect inspection system of the present invention.

Next, a mask defect inspection system of the present embodiment will be explained. The mask defect inspection system of the present embodiment has as shown in FIG. 9 a defect inspection part 41, a control part 42, and an acceptable defect size table recording part 43. At the defect inspection part 41, light passing through a photomask, for example, is detected by using a CCD image sensor.

The pattern of the passing light detected by the CCD image sensor is processed and compared with for example the designed pattern. The pattern can be compared with not the designed pattern but also another photomask fabricated on the basis of the same designed pattern. A different part from the designed pattern or the pattern of the other photomask is detected as a defect.

According to a defect diagnosis algorithm executed at the mask defect inspection system of the present embodiment, when a defect is detected, the defect inspection part 41 recognizes the line width of the pattern nearest from the defect and the space of the defect part from the pattern. The control part 42 calculates the pattern pitch from the recognized line width and pattern space.

Next, the control part 42 selects from the table of the acceptable defect sizes recorded in advance at the acceptable defect size table recording part 43 the acceptable defect size corresponding to the predetermined defect type, pattern size, and pattern pitch. Then the control part 42 compares the selected acceptable defect size with the size of the defect detected by the defect inspection part 41. Out of the detected defects, only a defect larger than the acceptable defect size is determined as a defect requiring repair. According to the mask defect inspection system of the present embodiment, it is possible to judge accurately and easily a defect requiring repair.

Figure 10A:
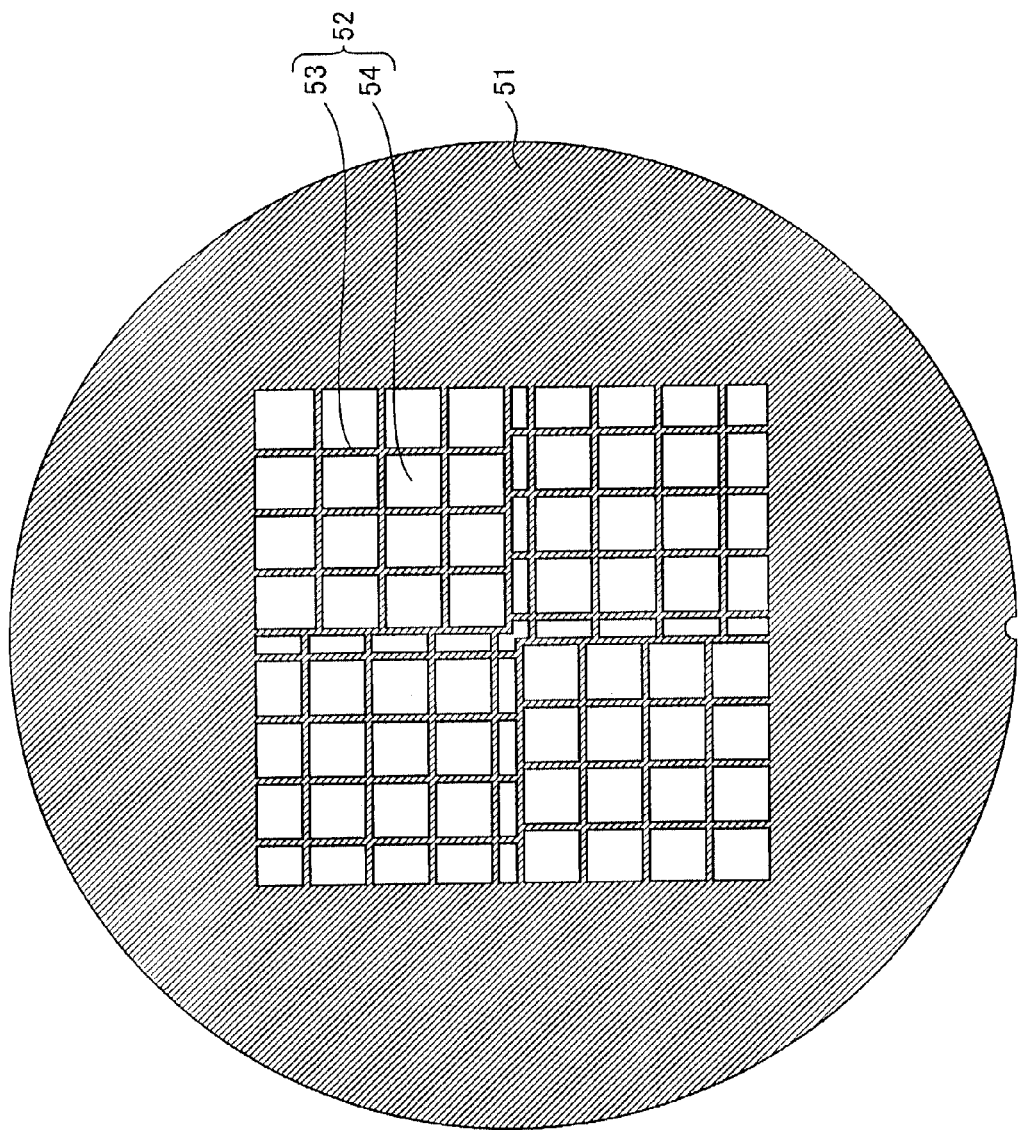
FIG. 10A is a plane view of a stencil mask to which a mask inspection method of the present invention is applied.
Figure 10C:
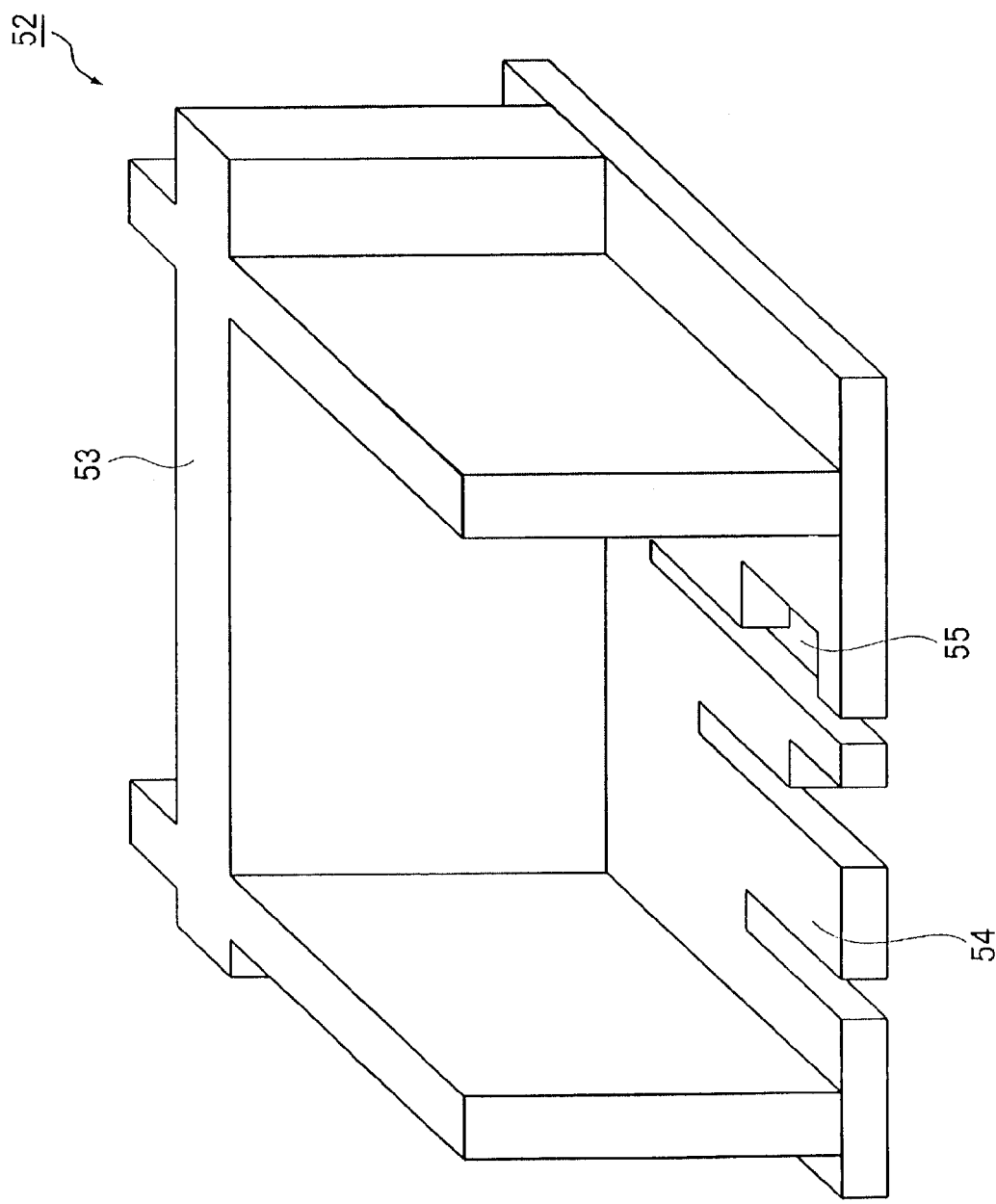
FIG. 10C is a perspective view of the mask of FIG. 10A.

FIG. 10A is a plane view of an example of a stencil mask to which the methods of inspection and production of a mask of the present embodiment are applicable. FIG. 10B is a cross-sectional view of the stencil mask of FIG. 10A, while FIG. 10C is a perspective view of a part of the stencil mask of FIG. 10A. The stencil mask shown in FIGS. 10A to 10C is preferably used for, for example, low energy electron beam proximity projection lithography (LEEPL)—one type of electron beam lithography.

As shown in FIGS. 10A to 10C, the stencil mask has a support frame made of for example a silicon wafer 51 and a membrane 52 of a thickness of several hundreds of nm to several μm. The membrane 52 is formed with struts 53 made of parts of the silicon wafer 51 and is supported by the struts 53. The part of the membrane 52 framed by the struts 53 (pattern formation region 54) is formed with apertures 55 in a predetermined device pattern. When using a silicon layer as the membrane 52, the stencil mask can be also fabricated from an SOI (silicon on insulator or semiconductor on insulator) wafer where the silicon layer is formed on the silicon wafer 51 via a silicon oxide film 56.

In LEEPL, the distance between the mask and the wafer is set at about several tens of μm and the mask is arranged just above the wafer. Then the pattern formation regions 54 are scanned with an electron beam of for example 2 keV to transfer the pattern on a resist on the wafer (T. Utsumi, *Journal of Vacuum Science and Technology*, B17, 2897 (1999)).

The mask structure comprised of the membrane 52 formed with the struts 53 is also employed in a mask used for electron beam lithography other than LEEPL such as projection exposure with variable axis immersion lenses (PREVAIL) and scattering with angular limitation in projection electron beam lithography (SCALPEL) or for an electron beam stepper. When applying the present invention to inspection of defects and production of a mask used for the above electron beam lithography, X-ray lithography, or other lithography, it is possible to deal with miniaturization of the line and space of patterns. Therefore, semiconductor devices can be integrated further.

The above embodiments of a mask inspection method, a mask defect inspection system, and a mask production method of the present invention are not limited to the above explanation. For example, the table of the acceptable defect sizes can be prepared by using both simulation of the light intensity and experiments using actually fabricated masks. In this case, results of the simulation of the light intensity can be corrected by the experimental results.

While an example of determination of an opaque defect caused by part of the light-blocking film remaining in a light-passing region was shown in the above explanation, the present invention can be applied to determination of a clear defect caused by part of the light-blocking film being missing too. In this case, a dedicated table of the acceptable defect sizes is prepared separately in advance. In addition, various modifications can be made within a scope not exceeding the gist of the present invention.

Summarizing the effects of the invention, according to the mask inspection method of the present invention, it becomes possible to accurately and easily determine a detected defect as an acceptable defect or one requiring repair.

According to the mask defect inspection system of the present invention, it becomes possible to detect defects and accurately and easily select a defect requiring repair.

According to a mask production method of the present invention, the throughput and yield of production of masks can be improved.

What is claimed is:

1. A method of inspection for detecting a pattern defect in a mask having a predetermined pattern of regions passing and blocking an exposure beam so as to transfer that pattern, comprising the steps of:
   presetting different acceptable defect sizes for a plurality of conditions differing in at least one of a line and space of the pattern,
   detecting a defect and recognizing the line and space of the pattern at the defect part,
   selecting an acceptable defect size corresponding to the line and space of the pattern recognized at the defect part and comparing it with the size of the detected defect, and
   determining a defect larger than the acceptable defect size as a defect requiring repair,
   wherein,
   the step of presetting the different acceptable defect sizes comprises the step of setting different acceptable defect sizes for a plurality of conditions differing in space between the pattern and defects.

2. A mask inspection method as set forth in claim 1, wherein the step of presetting the different acceptable defect sizes comprises the step of setting different acceptable defect sizes for a condition where the pattern and a defect are in contact and a condition where the pattern and a defect are separated.

3. A mask inspection method as set forth in claim 1, wherein the step of presetting the different acceptable defect sizes comprises the step of finding a line width of the pattern transferred by the mask by simulation of the light intensity under a plurality of conditions differing in at least one of the line and space of the pattern.

4. A mask inspection method as set forth in claim 1, wherein the step of presetting the different acceptable defect sizes comprises the steps of fabricating masks differing in at least one of the line and space of the pattern, performing actual exposure, and measuring the line widths of the pattern transferred due to the masks.

5. A mask inspection method as set forth in claim 1, wherein the step of presetting the different acceptable defect sizes comprises the step of preparing a table of acceptable defect sizes linking at least one of the line and space of the pattern with the acceptable defect size.

6. A mask inspection method as set forth in claim 1, wherein the exposure beam is ultraviolet light and the mask is one of a binary mask and a phase shift mask.

7. A mask inspection method as set forth in claim 1, wherein the exposure beam is a charged particle beam and the mask is one of a stencil mask and a membrane mask.

8. A mask defect inspection system for detecting a pattern defect in a mask having a predetermined pattern of regions passing and blocking an exposure beam so as to transfer that pattern, comprising:
   a memory means for recording preset different acceptable defect sizes for a plurality of conditions differing in at least one of a line and space of the pattern,
   a pattern identifying means for comparing a mask pattern with a reference pattern to detect a defect,
   a measuring means for recognizing the line and space of the pattern at the detected defect part, and
   a defect determining means for selecting an acceptable defect size corresponding to the line and space of the pattern recognized at the defect part from the acceptable defect sizes recorded in the memory means, comparing it with the size of the detected defect, and determining a defect larger than the acceptable defect size as a defect requiring repair.

9. A mask defect inspection system as set forth in claim 8, wherein the acceptable defect sizes recorded in the memory means include different acceptable defect sizes set for a plurality of conditions differing in space between the pattern and a defect.

10. A mask defect inspection system as set forth in claim 8, wherein the acceptable defect sizes recorded in the memory means include different acceptable defect sizes set for a condition where the pattern and a defect are in contact and a condition where the pattern and defect are separated.

11. A mask defect inspection system as set forth in claim 8, wherein the acceptable defect sizes recorded in the memory means are preset by finding by simulation of the light intensity the line widths of the pattern transferred by the mask under a plurality of conditions differing in at least one of the line and space of the pattern.

12. A mask defect inspection system as set forth in claim 8, wherein the acceptable defect sizes recorded in the memory means are preset by fabricating masks differing in at least one of the line and space of the pattern, performing actual exposure, and measuring the line widths of the pattern transferred by the masks.

13. A mask production method comprising the steps of: forming a predetermined pattern of regions passing and blocking an exposure beam in a mask and detecting defects of the pattern, said step of detecting the defects comprising the steps of:
   presetting different acceptable defect sizes for a plurality of conditions differing in at least one of a line and space of the pattern,
   detecting a defect and recognizing the line and space of the pattern at the defect part, selecting an acceptable defect size corresponding to the line and space of the pattern recognized at the defect part and comparing it with the size of the detected defect, determining a defect larger than the acceptable defect size as a defect requiring repair, and repairing a defect determined as a defect requiring repair, wherein, the step of presetting the different acceptable defect sizes further comprises a step of setting different acceptable defect sizes for a plurality of conditions different in the space between the pattern and a defect.

14. A mask production method as set forth in claim 13, wherein the step of presetting the different acceptable defect sizes comprises a step of finding by simulation of the light intensity the line widths of the pattern transferred by masks under plurality of conditions different in at least one of the line and space of the pattern.

15. A mask production method as set forth in claim 13, wherein the step of presetting the different acceptable defect sizes comprises the steps of fabricating masks different in at least one of the line and space of the pattern, performing actual exposure, and measuring line widths of the pattern transferred by the masks.

16. A mask production method as set forth in claim 13, wherein the exposure beam is ultraviolet light and the mask is one of a binary mask and phase shift mask.

17. A mask production method as set forth in claim 13, wherein the exposure beam is a charged particle beam and the mask is one of a stencil mask and a membrane mask.

* * * * *